United States Patent
Doll (10) Patent No.: US 6,517,249 B1
(45) Date of Patent: Feb. 11, 2003

(54) BEARING WITH AMORPHOUS BORON CARBIDE COATING

(75) Inventor: Gary L. Doll, Canton, OH (US)

(73) Assignee: The Timken Company, Canton, OH (US)

( * ) Notice: Subject to any disclaimer, the term of this patent is extended or adjusted under 35 U.S.C. 154(b) by 0 days.

(21) Appl. No.: 09/587,849

(22) Filed: Jun. 6, 2000

(51) Int. Cl.[7] .............................................. F16C 33/30
(52) U.S. Cl. ....................................... 384/492; 384/625
(58) Field of Search ....................... 384/492, DIG. 913, 384/565, 569, 625, DIG. 912; 428/698

(56) References Cited

U.S. PATENT DOCUMENTS

| | | |
|---|---|---|
| 3,726,572 A | 4/1973 | Beardmore |
| 3,912,346 A * | 10/1975 | Boratynski et al. .......... 384/568 |
| 4,316,921 A * | 2/1982 | Taylor et al. ................ 384/907 |
| 4,541,819 A | 9/1985 | Mazziotti |
| 4,590,031 A | 5/1986 | Eichen et al. |
| 4,594,294 A | 6/1986 | Eichen et al. |
| 4,619,865 A | 10/1986 | Keem et al. |
| 4,643,951 A | 2/1987 | Keem et al. |
| 4,645,715 A | 2/1987 | Ovshinsky et al. |
| 4,716,083 A | 12/1987 | Eichen et al. |
| 4,717,632 A * | 1/1988 | Keem et al. ................. 428/698 |
| 4,966,552 A * | 10/1990 | Gonser ......................... 384/492 |
| 5,222,914 A | 6/1993 | Mazziotti |
| 5,593,234 A | 1/1997 | Liston |
| 5,718,516 A | 2/1998 | Cheever et al. |
| 2001/0028926 A1 | 10/2001 | Strondl et al. |

FOREIGN PATENT DOCUMENTS

| | | |
|---|---|---|
| EP | 1002964 | 5/2000 |
| EP | 1123989 | 8/2001 |
| JP | 10184696 | 7/1998 |

OTHER PUBLICATIONS

Balzers AG Wear Protection Division SI– "The guide to more reliable precision components"—1995 edition.
Diamond BLACK Technologies Inc.—Website—Diamondblack.com—Printed Oct 18, 1999.

* cited by examiner

Primary Examiner—William C Joyce
(74) Attorney, Agent, or Firm—Polster, Lieder, Woodruff & Lucchesi (57) ABSTRACT

The raceways and/or rolling elements of an anti-friction bearing are coated with an amorphous boron-carbide coating having a dense microstructure. The coating has a thickness of about 0.1 $\mu$m to about 5 $\mu$m and is applied at low substrate temperatures and high adatom mobilities. Prior to applying the boron-carbide coating, an interfacial layer is applied to the bearing surface to help the boron-carbide coating to adhere to the surface. The interfacial layer is a metal layer that is deposited on the bearing surface, or a layer of boron and carbon atoms which are diffused into the bearing surface. If a metal interfacial layer is used, then, there is a gradual transition between the interfacial layer of pure metal and the boron-carbide coating. When the bearing assembly is coated in this manner, the bearing assembly will have a longer lifetime, have a cooler operation and higher rotational speeds, have an increased power density, and exhibit greater debris resistance than uncoated bearing assemblies.

20 Claims, 7 Drawing Sheets

FIG. 3: Boron Carbide Coating With An Open Microstructure

FIG. 4: Boron Carbide Coating With A Dense Microstructure

FIG. 5A
Rockwell Adhesion Test showing Boron Carbide Coating with poor adhesion to a steel substrate FIG. 5B
Rockwell Adhesion Test showing Boron Carbide Coating with good adhesion to a steel substrate

FIG. 6

Fatigue life enhancements possible by boron carbide coatings applied to the races of ground and honed (smooth) bearing races.

FIG. 7

Fatigue life enhancements possible by boron carbide coatings applied to the races of tapered roller bearings operating in a debris filled environment.

FIG. 8

Rotational speed enhancements possible by boron carbide coatings applied to the rib-roller end interface of tapered roller bearings operating in a oil-mist lubricating environment.

BEARING WITH AMORPHOUS BORON CARBIDE COATING

CROSS-REFERENCE TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

This invention relates to anti-friction bearings, and, in particular, to a coating for the bearing which will increase the bearings adhesive and abrasive wear resistance, and reduce the bearings operational temperature to enable the bearing to have a longer useful life.

In attempting to increase the efficiency, performance, and reliability of machinery, anti-friction bearings have approached the limits of their load bearing capacity. Additionally, bearings do not always operate in their ideal state of elasto-hydrodynamic lubrication, but in operating states that entail increased wear: such as mixed layer lubrication, boundary layer lubrication, dry operation, or wear caused by abrasive particles.

In elasto-hydrodynamic lubrication, the bearing's rolling elements are separated by a supporting lubricating film which allows bearings to attain their maximum service life. Under normal operating conditions, the maximum service life is determined primarily by the strength of the bearing material.

In mixed or boundary layer lubrication situations, supporting lubricating films do not develop during operation. Under rolling and sliding contact, the asperities of the bearing elements (i.e., the rolling elements and the raceways) contact each other, the surfaces suffer from wear, and the service life of the bearing is reduced.

Although dry running is not desirable operating condition, rolling element bearings many times are subjected to accidental or momentary oil loss. Sometimes the excessive wear associated with this oil loss can potentially cause catastrophic damage to the machinery.

Today, the wear problems are primarily addressed with very pure grades of steel, sophisticated heat treatment methods, new lubricants, and improved seals. These wear problems can also be addressed by applying coatings with specific mechanical properties to the bearing elements.

BRIEF SUMMARY OF THE INVENTION

I have found that when the rolling elements and raceways of anti-friction bearings are coated with an amorphous boron carbide coating, the operational performance of the bearings is increased dramatically. Boron carbide exhibits high wear resistance, dimensional accuracy, and toughness. Boron carbide with an approximate stoichiometry of $B_4C$ is the third hardest material currently known, behind diamond and cubic boron nitride. The extreme hardness of boron carbide makes it resistant to abrasion from debris, and wear resistant from the point of view of asperity contact. Boron carbide is most useful for mechanical components when it does not possess long range structural order. This incoherent, or amorphous form of boron carbide does not typically suffer from the large compressive stresses that other hard coatings possess. Consequently, tribological coatings with sufficient thickness and with excellent adhesive strengths to steel can be realized. Additionally, amorphous boron carbide coatings also have very good fracture toughness, and are resistant to mechanisms of crack propagation that occur in crystalline coatings.

The boron carbide coating can be applied through physical and/or chemical vapor deposition processes. Whereas coatings deposited by chemical vapor deposition processes are usually grown with very high substrate temperatures, boron carbide coatings deposited by physical vapor deposition processes can be grown at temperatures well below the tempering points of low alloy steels.

Boron carbide coatings can be applied to substrates with or without an adhesion enhancing or interfacial interlayer which is about 0.1 mm thick. The interfacial layer is a metal such as titanium or chromium. The interfacial layer may also be formed by diffusing boron and carbon atoms into the steel surface to be coated, for example, by applying a high bias voltage during the initial stages of deposition.

The coating itself is preferably about 0.1 $\mu$m–5 $\mu$m thick. It can be doped with semiconducting (e.g., Si) or metallic elements (e.g., Al, Ti, W, or Cr) which can be used to modify the mechanical properties of the coating should that prove to be desirable. Further modification of the mechanical properties of boron carbide can be accomplished by doping the coatings with gaseous elements (e.g., H, N).

BRIEF DESCRIPTION OF THE SEVERAL VIEWS OF THE DRAWINGS

Corresponding reference numerals will be used throughout the several figures of the drawings.

DETAILED DESCRIPTION OF THE INVENTION

The following detailed description illustrates the invention by way of example and not by way of limitation. This description will clearly enable one skilled in the art to make and use the invention, and describes what I presently believe is the best mode of carrying out the invention.

Figure 1:
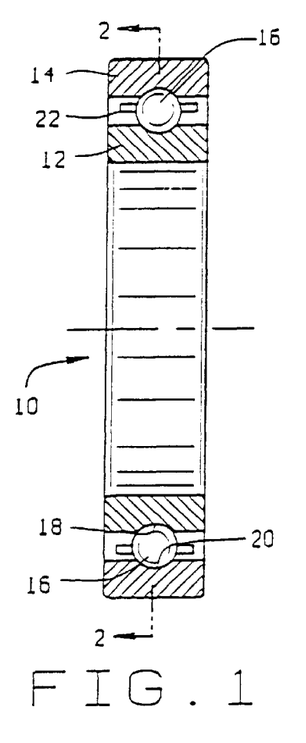
FIG. 1 is a radial cross-sectional view of a typical anti-friction bearing.
Figure 2:
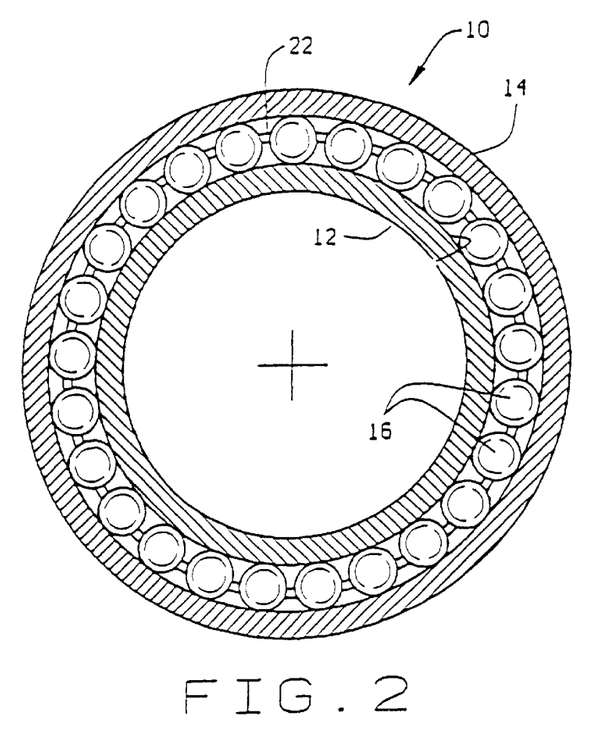
FIG. 2 is a lateral cross-sectional view of the bearing taken along line 2—2 of FIG. 1.

A bearing assembly 10 is shown in FIGS. 1 and 2. The bearing 10 includes an inner race 12 and an outer race 14 which surrounds the inner race 12 and is spaced from, the inner race 12. A plurality of rolling elements 16 are located in the annular space between the races 12 and 14. The rolling elements 16 are shown as balls, but could be any other type of rolling element found in a rotational, anti-friction bearing. Actually, the balls 16 contact the inner race 12 along a raceway 18 and contact the outer race 14 along a raceway 20. The two raceways 18 and 20, which are the critical surfaces for the races 12 and 14, take the form of grooves that are concave in cross-section, with the curvature generally conforming to the curvature of the balls 16. In addition, the bearing 10 includes a cage 22 having pockets which receive the balls 16. The cage 22 maintains the proper spacing between the balls 16. Although a ball journal bearing is shown in FIGS. 1 and 2, it will be appreciated that the present invention is applicable to other types of bearings as well, such as the various types of roller bearings, for example.

I have found that by coating the rolling elements 16 and the raceways 18 and 20 of the inner and outer races 12 and 14 with an amorphous boron carbide coating the bearing assembly will exhibit increased adhesive and abrasive wear resistance. This enables the bearing to have a cooler operating temperature (when compared to an uncoated bearing), to achieve higher rotational speeds, and to have an increased power density. Preferably, the coating has an approximate stoichiometry of $B_4C$ and is applied to the bearing elements to a thickness of about 0.1 µm to about 5 µm. The coating is applied by physical vapor deposition (PVD), but can also be applied by chemical vapor deposition (CVD) or a hybrid PVD/CVD process.

Description of the Process to Coat Bearings

As noted, the boron carbide coating can be applied by means of chemical vapor deposition (CVD), physical vapor deposition (PVD), or a combination of both. In a CVD process, boron-containing gases such as $BCl_3$ or $B_2H_6$ can be combined with gases such as CO or $CH_4$ in a vacuum furnace to form boron carbide coatings. The reactions can be described as:

$$BCl_3 + CO + H_2 \xrightarrow{1200\ C.} B_4C, \text{ or}$$

$$B_2H_6 + CH_4 \xrightarrow{1200\ C.} B_4C$$

Figure 3:
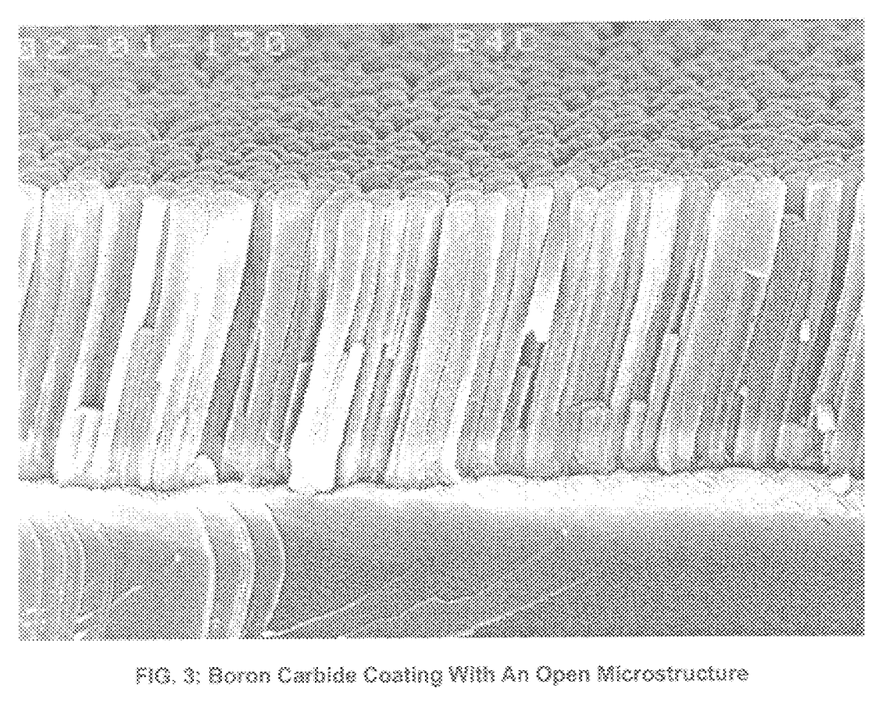
FIG. 3 is a photomicrograph of a boron carbide coating with an open microstructure.

In order to generate the desirable chemical reactions, the CVD process is carried out either at high temperature or in a plasma. The stoichiometry of the boron carbide coating is determined by the relative flow rates of the boron and carbon containing gases. Usually, a stoichiometry of $B_4C$ is targeted, although other stoichiometries are also desirable. For tribological coatings in general, and bearing coatings in particular, an amorphous form of $B_4C$ is desirable. This is because crystalline, ceramic coatings are more susceptible to crack initiation and propagation than amorphous phases. Amorphous is defined here to describe coatings possessing little or no long-range crystalline order. To obtain amorphous coatings, the boron carbide must be deposited at substrate temperatures well below the melting point of the desired boron carbide phase. For, $B_4C$, this corresponds to $T_m = 2420°$ C. At the same time, the boron carbide coating needs to be applied with sufficient adatom mobility to ensure that the coating forms a dense microstructure. Sufficient adatom mobility refers to the ability of the deposited atoms (in this case Boron and Carbon are the adatoms) to move or flow on the surface instead of sticking where they initially impact. An open, columnar microstructure (such as shown in FIG. 3) is undesirable for tribological coatings since that type of microstructure promotes fracture of the columnar grains leading to excessive wear and debris generation. The adatom mobility is determined by the substrate temperature and the kinetic energy of the arriving atoms. If a plasma is incorporated in a CVD process, the kinetic energy of the arriving species can be increased through an electrical bias of the substrate. This bias can be either ac or dc in nature. Without a plasma, adatom mobility in a CVD process is governed solely by the substrate temperature.

In a PVD process, boron carbide can be deposited directly from solid phase materials such as boron, carbon, or boron carbide. The most common PVD process used to deposit boron carbide coatings is magnetron sputtering. Boron and carbon species are sputtered from solid phase targets by means of an easily ionizable gas such as argon. The sputtered atoms then condense onto substrates, (in this case, rolling element bearings). The desirable characteristics of the boron carbide coatings grown by PVD processes are the same as those discussed for the CVD processes above.

Deposition processes that utilize a combination of PVD and CVD processes can also be used to deposit boron carbide coatings. An example of such a process is one in which boron is sputtered (PVD) in the presence of a hydrocarbon gas such as $CH_4$ (CVD). The desirable characteristics of boron carbide films grown in this hybrid process are also identical to those discussed above.

Regardless of the process type (CVD, PVD or hybrid), there are similar steps in the deposition cycle. The first step is usually a plasma etch of the substrate (i.e., the raceway or roller element to be coated). Here, the substrate is biased to a relatively high voltage (e.g.,–500 VDC), and argon gas is introduced into the deposition chamber. The argon ionizes in the presence of the strong electric field and argon ions impinge on the substrate, sputtering contaminates off the surface. The duration of this step depends upon the initial cleanliness of the substrate surface. The argon gas pressure and flow rate will depend upon the geometry of the deposition chamber, and the type of bias (ac vs. dc) applied to the substrate. The bias voltage, flow rate, and gas pressure are typically adjusted to provide the necessary substrate bias current density to adequately etch the substrate.

Boron carbide does not inherently bond well to steel. For that reason, interfacial layers are used to transition between the steel and the coating. A good interfacial layer can be accomplished by applying a metal such as titanium or chromium to the substrate. Another way to form a good interfacial layer is to diffuse boron and carbon atoms into the steel surface to be coated. This can be accomplished by applying a high bias voltage (about –250V to about –1000V) during the initial stages of deposition of the boron-carbide coating. The voltage applied can be either ac or dc. If an ac voltage is applied, a lower voltage can be used. The interaction of the energetic argon ions heats the near surface region of the steel allowing the boron and carbon atoms to diffuse into the steel. Typically, this interfacial layer is about 0.1 mm thick from a deposited metal, but much less from diffusion.

If a metal was used as an interfacial layer, it is usually considered desirable to transition gradually between the pure metal and the boron carbide coating. In magnetron sputtering, this can be accomplished by reducing the power applied to the metal targets while simultaneously increasing the power applied to the boron carbide targets. Once the power to the metal targets has reached the desired level, the coating is applied. The thickness of the transition region depends upon the deposition system characteristics, but is typically on the order of the interfacial layer. The purpose for this transition region is to initiate a desirable coating microstructure and to avoid potential excessive stress generation in the coating due to thermo-mechanical effects that can arise at abrupt interfaces between different material types. For example, depositing $B_4C$ directly onto chromium would result in a metal-ceramic interface that could suffer from thermal expansion mismatches and a statistical enhancement for mechanical fracture.

The last step in the deposition is the application of the boron carbide coating itself. As mentioned above, boron carbide can have various stable stoichiometries, as well as contain additional elements such as metals (for example, aluminum, titanium, chromium, tungsten, etc.), gases (for example, hydrogen, nitrogen, etc), and semimetals (for example, carbon). Adding metals in low concentrations (i.e., <10%) tends to form solid phase solutions $M_xB_yC$ that can have higher hardness and greater oxidation resistance than undoped boron carbide. At higher concentrations (i.e., >10%) metals tend to promote the formation of mixed phase composites. For example, when doped with titanium a mixed phase composite of $TiB_2$ and $B_4C$ forms. These composite phases can also posses high hardness and other desirable properties. Adding gaseous elements such as hydrogen and nitrogen can also alter the properties of the boron carbide either through the formation of ternary solid solutions (e.g. BCN), or through the realization of novel mixed phase composites (e.g. BN/C). Adding extra carbon to the coating can alter the stoichiometry of the boron carbide, or promote the formation of a mixed phase composite (e.g. $B_4C/C$). The choice of stoichiometry, or solid solutions vs. mixed phase composites depends upon the desired functionality of the coating.

For the specific case of rolling contact bearings, each modification of the boron carbide coating discussed above has merit, depending upon the particular situation or operating environment of the bearing application. To increase bearing life, boron carbide coatings can be applied to the races of the rolling elements (balls or rollers) or to the races of the inner and outer rings. In a well-lubricated environment, virtually no contact is made between the rolling elements and the inner and outer ring races.

Figure 4:
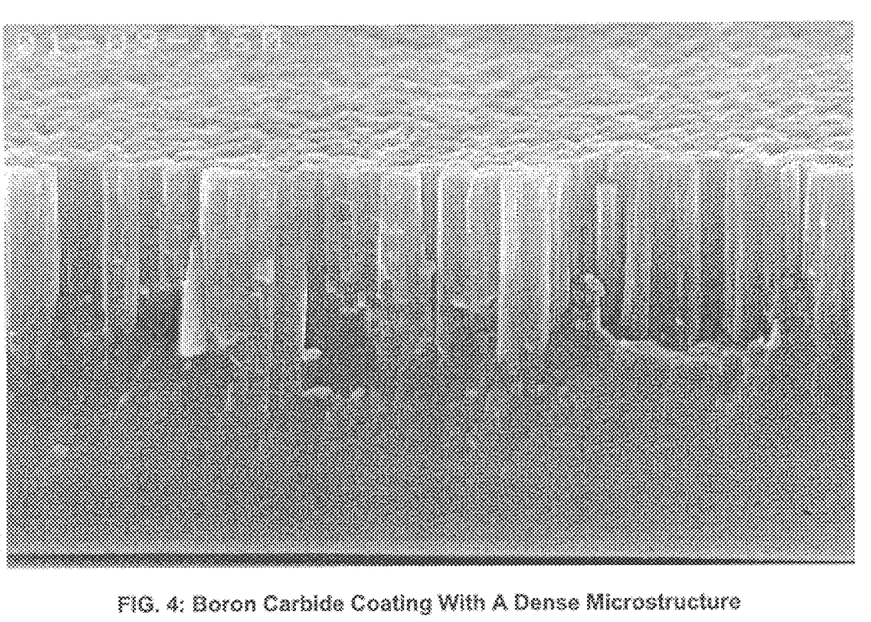
FIG. 4 is a photomicrograph of a boron carbide coating with a dense microstructure.

Although coatings can increase fatigue life when a bearing is operated in a well-lubricated environment, it is believed that coatings can only benefit or increase fatigue life which is limited by surface initiated failures. A coating will not affect fatigue life limitations associated by subsurface material properties. However, the majority of real world bearing applications experience some degree of metal-metal contact. The boron carbide coating increases fatigue life in these instances by providing barriers to adhesive and abrasive interactions. Every occurrence of an adhesive or abrasive interaction in a rolling contact mode creates a statistical probability for a surface crack initiation site. The boron carbide coating decreases the occurrence of these interactions, thereby increasing the statistical fatigue life of the bearing. To accomplish this, the coating should be harder than the steel, but elastic enough to accommodate plastic deformation of its substrate. The coating should also have a dense microstructure (such as shown in FIG. 4) so that it does not fracture under cyclic loading conditions. By "dense" it is meant that the density of the coating is >90% of the density of solid (i.e., crystalline) $B_4C$ material. The coating topography should be smooth enough to minimize the risk of abrasive contact on an uncoated element of the bearing.

It is the nature of coatings grown by PVD or CVD processes to have compressive stress, which scales with the thickness of the coating. There are many reasons for this, but the scaling many times depends upon the difference in the elastic moduli of the coating and the substrate. For $B_4C$, this means that for typical bearing loads, the desirable thickness of the coating to increase fatigue life is on the order of about 0.1 $\mu$m to about 5 $\mu$m.

In rolling contact bearings where there is a significant amount of sliding motion (e.g., the rib-roller end contact in tapered roller bearings or on spherical roller bearing races), boron carbide coatings also provide a barrier to adhesive and abrasive wear. Where the lubricant film thickness is low enough such that significant metal-metal contact occurs on an uncoated bearing, the boron carbide coating can provide a protective barrier to stave off adhesive and abrasive interactions. These interactions can cause premature bearing failure due to scuffing or galling. A boron carbide-steel interface under sliding contact does not have a low coefficient of friction. However, boron carbide surfaces are susceptible to oxidation, and the subsequent formation of boric acid (as a result of the oxidation) does have a very low friction coefficient against steel. Additives to lubricant oils and greases usually are highly oxidizing. It is believed that the chemical interactions between the additives and the boron carbide can produce a low friction surface on the coated surfaces. The oxidized surface has a much higher wear rate than the unoxidized boron carbide, and it should be expected that in the presence of highly oxidizing environments, boron carbide coatings would wear more easily. The thickness of the boron carbide coating applied to sliding contact areas can be up to several micrometers thick (i.e., about 0.1–5 $\mu$m) since the loads there are usually distributed over larger areas and the Hertzian contact stress is less than on the rolling surfaces.

II. Description Properties Tests

As discussed above, some of the more important properties of boron carbide coatings that affect rolling element bearing performance are hardness, modulus, adhesive strength, coating stoichiometry, amorphousness (lack of crystallinity), topography, and microstructure. Those properties, and how they are measured, are displayed in the following table.

| PROPERTY | VALUE | MEASUREMENT TECHNIQUES |
|---|---|---|
| Hardness | ~25 Gpa | Indentation - micro & nano |
| Modulus | ~280 GPa | Indentation - micro & nano |
| Adhesive Strength | Superior | Rockwell Indentation & visual inspection |
| Stoichiometry | $B_4C$ | Auger Electron Spectroscopy, XPS, RBS |
| Crystallinity | Amorphous | Transmission Electron Microscopy |
| Topography | 10 nm Ra | Profilometry - stylus or optical |
| Microstructure | Dense | Cross Sectional SEM |

Examples of boron carbide coatings that have open and dense microstructures are shown in FIGS. 3 and 4. These images were taken using a scanning electron microscope in a cross-sectional geometry. The boron carbide coating shown in FIG. 3 was grown at low substrate temperatures (less then about 150° C.) and low adatom mobilities. The coating shown in FIG. 4 was also grown at low substrate temperatures (less then about 150° C.), but with high adatom mobilities.

Figure 5A:
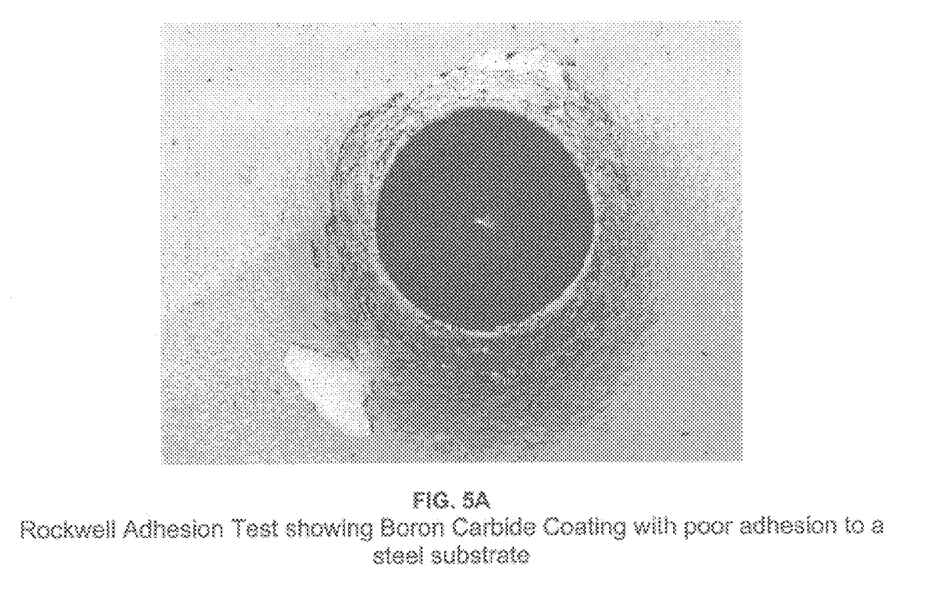
FIGS. 5A and 5B are photomicrographs of the boron carbide coating after a Rockwell adhesion test, FIG. 5A showing poor adhesion of the coating and FIG. 5B showing good adhesion of the coating.
Figure 5B:
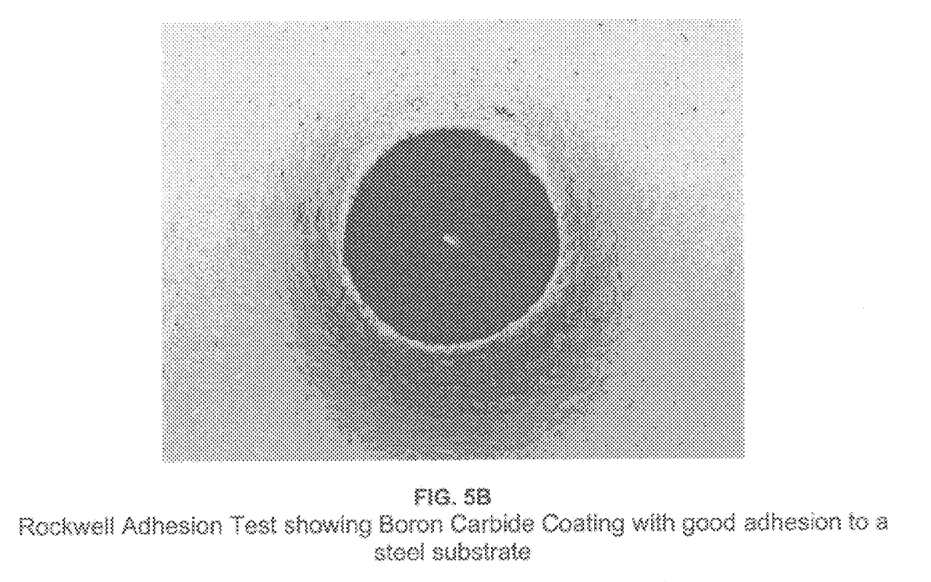

FIGS. 5A and 5B show qualitative measurement of the adhesion of boron carbide coatings. The measurement technique utilizes a Rockwell C diamond indentation of the coating and the substrate, then a visual inspection of the indented region. If the coating has poor adhesion to the substrate, it will delaminate, as is the case for FIG. 5A. On the other hand, if the coating has adequate adhesion, it will remain bonded to the substrate, as is the case of the coating shown in FIG. 5B. The coating will delaminate, as in FIG. 5A when subject to too high a compressive stress or when the surfaces are inadequately cleaned prior to coating.

III. Description of Bearing Test Results

Figure 6:
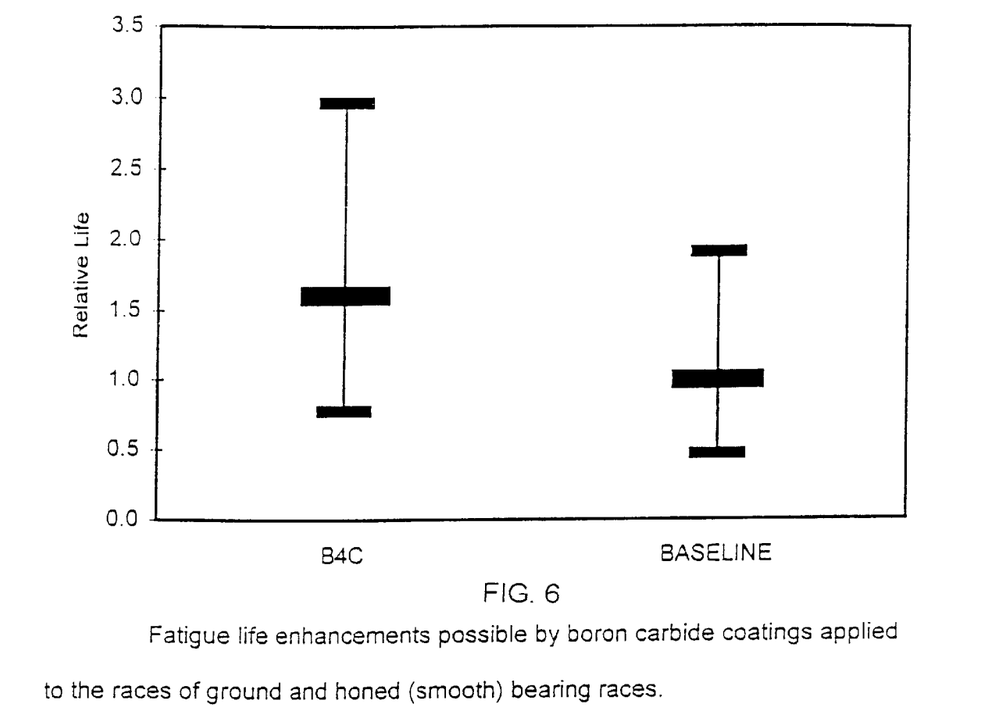
FIG. 6 is a graph comparing the relative life of a bearing in which the boron carbide coating was applied to the races with an uncoated bearing.

FIG. 6 graphically shows the results of rolling contact fatigue life tests performed on highly finished (ground and honed) bearing races having a 1 µm thick boron carbide coating of the present invention and identical baseline bearings that were uncoated. The center bars on the graph indicate the relative L50 lives normalized to baseline, and the error bars denote the upper and lower 65% confidence bands. The boron carbide coating was applied only to the inner races of these bearings; the balls were not coated. It is evident from the data that the boron carbide coating increased the L50 lives of these bearings by over 50%.

Figure 7:
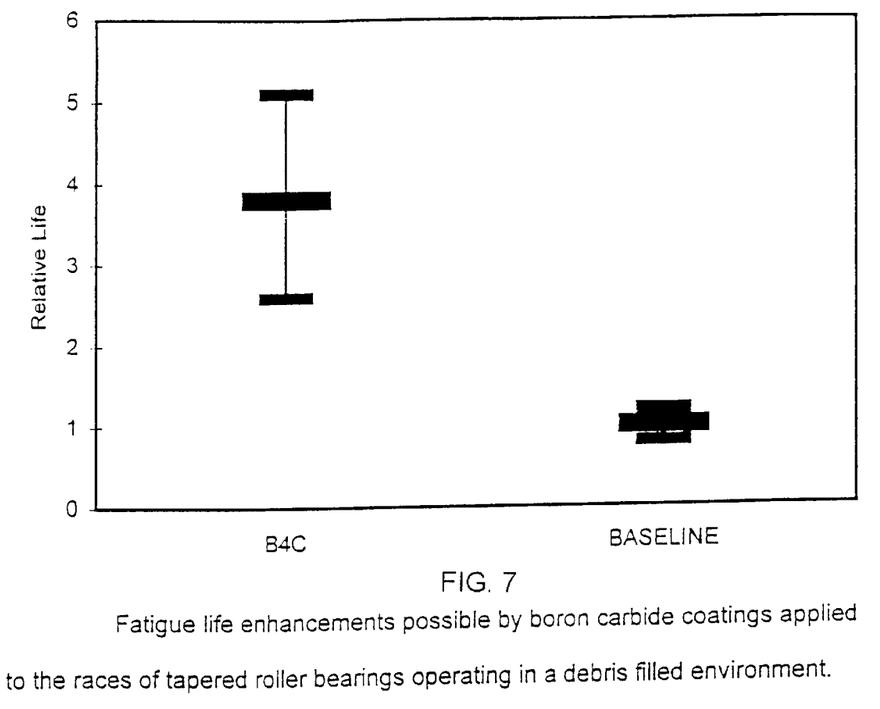
FIG. 7 is a graph comparing the relative life of a bearing in which the boron carbide coating was applied to the races with an uncoated bearing wherein the bearings are operated in a debris filled environment.

FIG. 7 displays the life improvement offered by boron carbide coatings of the present invention to tapered roller bearings operating in a debris filled environment. The debris in this test was 5 µm diameter steel particles that were deliberately added to the lubricating oil. The center bars in the graph denote the L15.91 lives normalized to baseline. A 2 µm thick boron carbide coating of the present invention was applied to the bearing races, and provided about a 3.8-fold increase in the L15.91 life over the uncoated, baseline tapered roller bearings.

Figure 8:
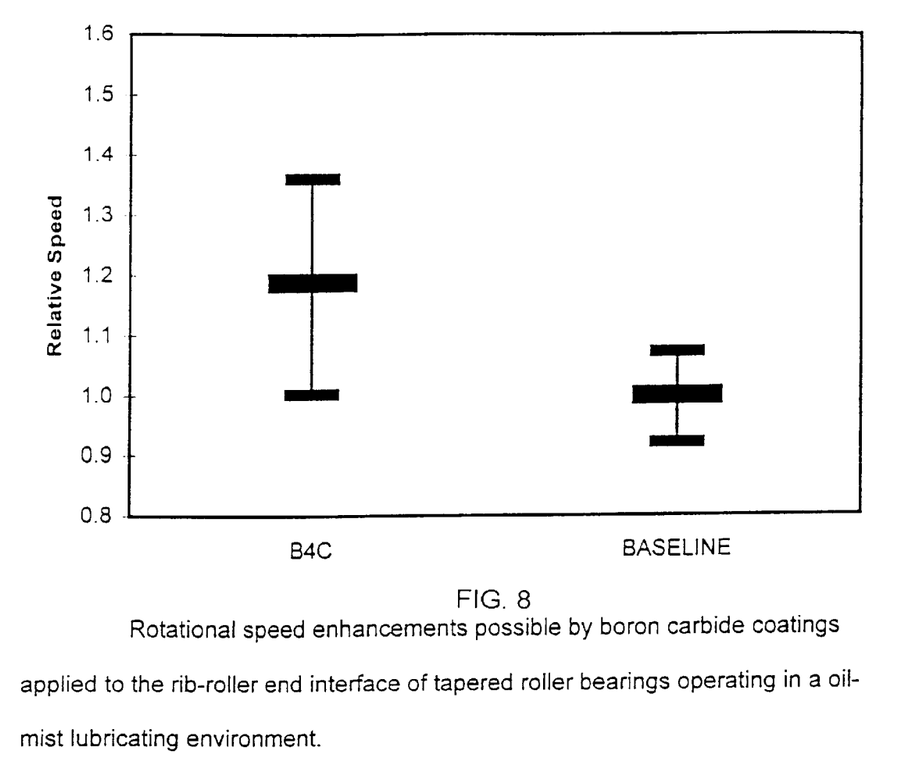
FIG. 8 is a graph comparing the relative operational speeds obtainable by a tapered roller bearing in which the rib-roller end interface of the bearing is coated with the boron carbide coating against an uncoated bearing wherein the bearings are operated in an oil-mist lubricating environment.

FIG. 8 displays test results for tapered roller bearings operating under an oil-mist lubrication environment. In this environment, the rib-roller end interface of a tapered roller bearing (when uncoated) is prone to scuffing at high rotational speeds. The data in this figure represent the maximum speed obtained by uncoated tapered roller bearings (baseline) and bearings with a boron carbide coating of the present invention applied to the roller ends. The center bars represent L50 values and the error bars represent the upper and lower 65% confidence bonds. From the data, it is apparent that the boron carbide coating on the roller ends permits a 20% higher operational speed than possible using uncoated tapered roller bearings in this lubrication environment.

As various changes could be made in the above constructions without departing from the scope of the invention, it is intended that all matter contained in the above description or shown in the accompanying drawings shall be interpreted as illustrative and not in a limiting sense.

What is claimed is:

1. An anti-friction bearing having a first race with a first raceway, a second race with a second raceway presented opposite, yet spaced from, the first raceway,, and a plurality of rolling elements located between the first and second raceways, such that when the first race rotates relative to the second race, the rolling elements will roll along the raceways, wherein at least one of the first raceway, second raceway, and rolling element is coated with an amorphous boron-carbide coating, the coating having a density greater than 90% of the density of crystalline $B_4C$.

2. The anti-friction bearing of claim 1 including an interfacial layer between the bearing surface to be coated and the boron-carbide coating.

3. The anti-friction bearing of claim 1 wherein the coating includes a doping agent.

4. The anti-friction bearing of claim 3 wherein the doping agent is a semi-conducting element, a metallic element, a gas, or a semimetal.

5. An anti-friction bearing having a first race with a first raceway, a second race with a second raceway presented opposite, yet spaced from, the first raceway, and a plurality of rolling elements located between the first and second raceways, such that when the first race rotates relative to the second race, the rolling elements will roll along the raceways, wherein at least one of the first raceway, second raceway, and rolling element is coated with an amorphous boron-carbide coating; there being an interfacial layer between the bearing surface to be coated and the boron-carbide coating and a transition area between the metal interfacial layer and the boron-carbide coating; the interfacial layer comprising a metal applied to the surface; the transition area having a thickness approximately equal to the thickness of the interfacial layer.

6. An anti-friction bearing having a first race with a first raceway, a second race with a second raceway presented opposite, yet spaced from, the first raceway, and a plurality of rolling elements located between the first and second raceways, such that when the first race rotates relative to the second race, the rolling elements will roll along the raceways, wherein at least one of the first raceway, second raceway,; and rolling element is coated with an amorphous boron-carbide coating; there being an interfacial layer between the bearing surface to be coated and the boron-carbide coating; the interfacial layer comprising boron and carbon atoms which have been diffused into the bearing surface.

7. The anti-friction bearing of claim 6 wherein the coating has a stoichiometry of $B_xC$, where x is approximately 4.

8. The anti-friction bearing of claim 7 wherein the coating has a density greater than 90% of the density of solid $B_4C$.

9. The anti-friction bearing of claim 6 wherein the coating has a thickness of about 0.1 µm to about 5 µm.

10. The anti-friction bearing of claim 6 wherein the coating has a hardness of about 25 GPa.

11. The anti-friction bearing of claim 6 wherein the coating has a modulus of about 280 GPa.

12. The anti-friction bearing of claim 6 wherein the interfacial layer has a thickness of about 0.1 mm.

13. The anti-friction bearing of claim 6 wherein the interfacial layer comprises a metal applied to the surface.

14. The anti-friction bearing of claim 9 wherein the metal is titanium or chromium.

15. The anti-friction bearing of claim 13 including a transition area between the metal interfacial layer and the boron-carbide coating.

16. The anti-friction bearing of claim 6 wherein the first raceway and second raceway are coated with the boron-carbide coating.

17. The anti-friction bearing of claim 6 wherein at least a portion of the rolling elements are coated with the boron-carbide coating.

18. An anti-friction bearing having a first race with a first raceway, a second race with a second raceway presented opposite, yet spaced from, the first raceway, and a plurality of rolling elements located between the first and second raceways, such that when the first race rotates relative to the second race, the rolling elements will roll along the raceways, wherein at least one of the first raceway, second raceway, and rolling element is coated with an amorphous boron-carbide coating; said coating including a doping gent which is a semi-conducting element, a metallic element, a gas, or a semimetal; and wherein the semi-conducting element is Si; the metallic element is chosen from the group consisting essentially of Al, Ti, W, Cr, and combinations thereof; the gas is chosen from the group consisting essentially of hydrogen, nitrogen, and combinations thereof; and the semimetal is carbon.

19. An anti-friction bearing having a first race with a first raceway, a second race with a second raceway presented opposite, yet spaced from, the first raceway, and a plurality of rolling elements located between the first and second raceways, such that when the first race rotates relative to the second race, the rolling elements will roll along the raceways, wherein at least one of the first raceway, second raceway, and rolling element is provided with a coating consisting essentially of an amorphous boron-carbide coating and a doping agent; the doping agent being chosen from the group consisting of doping agent is semi-conducting elements, metallic elements, a gas, a semimetal, and combinations thereof, wherein the coating has a density greater than 90% of the density of crystalline $B_4C$.

20. The anti-friction bearing of claim 19 wherein the semi-conducting element is Si; the metallic element is chosen from the group consisting essentially of Al, Ti, W, Cr, and combinations thereof; the gas is chosen from the group consisting essentially of hydrogen, nitrogen, and combinations thereof; and the semimetal is carbon.

* * * * *